(12) United States Patent
Ouyang et al.

(10) Patent No.: US 12,270,098 B2
(45) Date of Patent: Apr. 8, 2025

(54) BISMUTH FERRITE FILM MATERIAL, METHOD FOR INTEGRALLY PREPARING BISMUTH FERRITE FILM ON SILICON SUBSTRATE AT LOW TEMPERATURE AND APPLICATION

(71) Applicant: QILU UNIVERSITY OF TECHNOLOGY, Shandong (CN)

(72) Inventors: Jun Ouyang, Jinan (CN); Miaomiao Niu, Jinan (CN); Hanfei Zhu, Jinan (CN)

(73) Assignee: QILU UNIVERSITY OF TECHNOLOGY, Jinan (CN)

( * ) Notice: Subject to any disclaimer, the term of this patent is extended or adjusted under 35 U.S.C. 154(b) by 0 days.

(21) Appl. No.: 17/918,684

(22) PCT Filed: Jul. 13, 2020

(86) PCT No.: PCT/CN2020/101680
§ 371 (c)(1),
(2) Date: Feb. 3, 2023

(87) PCT Pub. No.: WO2021/208276
PCT Pub. Date: Oct. 21, 2021

(65) Prior Publication Data
US 2023/0183853 A1 Jun. 15, 2023

(30) Foreign Application Priority Data
Apr. 13, 2020 (CN) .......................... 202010285269.4

(51) Int. Cl.
C23C 14/16 (2006.01)
C23C 14/02 (2006.01)
(Continued)

(52) U.S. Cl.
CPC .............. *C23C 14/16* (2013.01); *C23C 14/02* (2013.01); *C23C 14/042* (2013.01);
(Continued)

(58) Field of Classification Search
CPC .......................... H01N 30/8561; H01N 30/076
(Continued)

(56) References Cited

U.S. PATENT DOCUMENTS

2007/0029592 A1* 2/2007 Ramesh ................. H10B 53/00
257/295

FOREIGN PATENT DOCUMENTS

| CN | 1766158 A | 5/2006 |
|----|-----------|--------|
| CN | 101157544 A | 4/2008 |

(Continued)

OTHER PUBLICATIONS

Pantel et al. "Switching kinetics in epitaxial BiFeO3 thin films", Journal of Applied Physics 107, 084111-1- 084111-4 (Apr. 2010). (Year: 2010).*

(Continued)

*Primary Examiner* — Rodney G McDonald
(74) *Attorney, Agent, or Firm* — Oliff PLC

(57) ABSTRACT

A bismuth ferrite film material, a method for integrally preparing a bismuth ferrite film on a silicon substrate at a low temperature, and an application, includes: magnetron sputtering a bottom electrode, a buffer layer and a bismuth ferrite film on one surface of a Si substrate in sequence from bottom to top at a processing temperature of 300-400° C.; reducing the temperature to room temperature; and a top electrode is deposited via magnetron sputtering on the surface of the bismuth ferrite film; the buffer layer mentioned hereof is a conductive oxide which matches the lattice of bismuth ferrite and is of a perovskite structure (ABO3). According to the present invention, the temperature for
(Continued)

preparing the bismuth ferrite film material can be reduced to 450° C. or below, and the bismuth ferrite film material has a high spontaneous electric polarization.

12 Claims, 1 Drawing Sheet

(51) Int. Cl.
   *C23C 14/04* (2006.01)
   *C23C 14/34* (2006.01)
   *C23C 14/35* (2006.01)
   *C23C 14/54* (2006.01)

(52) U.S. Cl.
   CPC ........ *C23C 14/3414* (2013.01); *C23C 14/352* (2013.01); *C23C 14/541* (2013.01)

(58) Field of Classification Search
   USPC .................................................. 204/192.17
   See application file for complete search history.

(56) References Cited

FOREIGN PATENT DOCUMENTS

| CN | 101587936 A | 11/2009 |
|---|---|---|
| CN | 101691655 A | 4/2010 |
| CN | 102051582 A | 5/2011 |
| CN | 103668060 A | 3/2014 |
| CN | 103839928 A | 6/2014 |
| CN | 107123648 A | 9/2017 |
| IN | 105336845 A | 2/2016 |
| JP | 2010-007121 A | 1/2010 |

OTHER PUBLICATIONS

Daisuke et al. "Chemical Substitution-Induced Ferroelectric Polarization Rotation n BiFeO3", Adv. Mater. 2011, 23, 1765-1769. (Year: 2010).*

Wu et al. "ZnO as a buffer layer for growth of BiFeO3 thin films", Journal of Applied Physics 108, 034102-1-034102-8 (2010). (Year: 2010).*

Jan. 31, 2021 International Search Report issued in Patent Application No. PCT/CN2020/101680.

Jan. 18, 2021 Office Action and Search Report issued in Chinese Patent Application No. 202010285269.4.

May 13, 2021 Office Action issued in Chinese Patent Application No. 202010285269.4.

Jan. 13, 2021 Written Opinion of the International Searching Authority issued in Patent Application No. PCT/CN2020/101680.

Liu, Yen-Ting et al., "Characteristics of highly orientated BiFeO3 thin films on a LaNiO3-coated Si substrate by RF sputtering.", Thin Films, (2010), vol. 518, pp. 7412-7415.

Lee, Yi-Hsien et al., "Low-temperature growth and interface characterization of BiFeO3 thin films with reduced leakage current.", Applied Physics Letters, (2005), vol. 87, No. 172901.

* cited by examiner

BISMUTH FERRITE FILM MATERIAL, METHOD FOR INTEGRALLY PREPARING BISMUTH FERRITE FILM ON SILICON SUBSTRATE AT LOW TEMPERATURE AND APPLICATION

CROSS-REFERENCES TO RELATED APPLICATIONS

This application claims priority benefits to Chinese Patent Application No. 202010285269.4, filed 13 Jun. 2020, the contents of which are incorporated herein by reference.

TECHNICAL FIELD

The present invention relates to electronic material development and thin film material preparation technologies, and specifically relates to a bismuth ferrite film material, a method for integrally preparing a bismuth ferrite film on a silicon substrate at a low temperature, and an application thereof.

BACKGROUND

Any discussion of the prior art throughout the specification should not be taken as an admission that such prior art is widely known or forms part of the common general knowledge in the art.

In recent years, ferroelectric materials, especially ferroelectric films, have wide application prospects in high-capacity memories, high energy density capacitors, micro-electro-mechanical systems, and other fields due to their characteristics of good ferroelectric, piezoelectric, dielectric, photoelectric, pyroelectric and the like, and are one of the frontiers and hot spots of scientific research at present.

Bismuth ferrite ($BiFeO_3$, BFO) is a multiferroic material having both ferroelectric and antiferromagnetic properties at room temperature, and has the advantages of a large residual polarization, a high dielectric constant, a fast piezoelectric response, a narrow band gap, environmental friendliness and the like. The coexistence and coupling of multiple properties can help create novel devices that are miniaturized, integrated, and multifunctional. Therefore, the coexistence of multiferroic properties and the associated excellent performances have brought bismuth ferrite broad application prospects in the fields of sensors, memories, actuators, optical devices, spin electronics, and the like.

It has been found by the inventor of the present invention that, in the practical applications of bismuth ferrite, the problems of a high preparation temperature, a large leakage current and the like exist. A high processing temperature will not only aggravate the problems of electric leakage, interface diffusion and the like, but also lead to the problems of defect migration, unstable chemical valence and stoichiometric ratio of elements and the like, due to the loss of the volatile $Bi_2O_3$. Furthermore, the compatibility of the bismuth ferrite film with the CMOS-Si technology and the large-scale integrated circuit faces a huge challenge at a high temperature. These problems make it difficult for the bismuth ferrite film to obtain an ideal electrical hysteresis loop, and create an easy break down. Such films are incompatible with the application technologies and will lead to device failures in severe cases.

SUMMARY

To address the deficiencies in the prior art, the objective of the present invention is to provide a bismuth ferrite film material, a method for integrally preparing a bismuth ferrite film on a silicon substrate at a low temperature, and an application thereof. According to the present invention, the technical solution of the present invention reduces the preparation temperature of bismuth ferrite film material to 300-400° C. and makes the bismuth ferrite film compatible with CMOS—Si technology and large-scale integrated circuit, and the bismuth ferrite film material described in the present invention has a high spontaneous electric polarization.

The technical solutions of the present invention are described as follows.

On one hand, a method for integrally preparing a bismuth ferrite film on a silicon substrate at a low temperature, comprising: magnetron sputtering a bottom electrode, a buffer layer and a bismuth ferrite film on one surface of a Si substrate in sequence from bottom to top at a processing temperature of 300-400° C.; reducing the temperature to room temperature, and a top electrode is deposited via magnetron sputtering on the surface of the bismuth ferrite film; the buffer layer is a conductive oxide which matches the lattice of bismuth ferrite and is of a perovskite structure ($ABO_3$).

Firstly, research reveals that if bismuth ferrite is directly contacted with the bottom electrode, film crystallization is not facilitated at a low processing temperature (less than or equal to 400° C.), so that the bismuth ferrite film with desired performances is difficult to prepare. According to the present invention, the addition of the conductive perovskite oxide matching the lattice of bismuth ferrite as a buffer layer, ensures the crystallized growth of bismuth ferrite at low temperatures to form the bismuth ferrite film with desired performances. Experiments show that the present invention can realize the low-temperature preparation of the bismuth ferrite film, and enhance the electric polarization of the bismuth ferrite film material prepared at a low temperature.

On the other hand, a bismuth ferrite film material, being obtained by a method for integrally preparing a bismuth ferrite film on a silicon substrate at a low temperature mentioned above.

The bismuth ferrite film material provided by the present invention has a high spontaneous electric polarization, especially a high remnant polarization value.

Since the bismuth ferrite film material provided by the present invention has a relatively high remnant polarization value, that is, a relatively high ferroelectric performance, which is beneficial to performance improvement of a variety of devices including sensors, memories, actuators, optical and spintronic devices, and therefore, in a third aspect of the present invention, an application of the bismuth ferrite film material in a sensor, a memory, an actuator, an optical device or a spintronic device is provided.

The beneficial effects of the present invention are as follows:

1. In the preparation process of the present invention, the deposition temperature of the material system is relatively low (300-400° C.), which is beneficial to its application in a large-area silicon integrated circuit; and the low preparation temperature greatly reduces the volatilization of elements in the system, avoids the defects due to interface diffusion, oxygen vacancies and the like, obtains a film material with excellent performances, including a high remnant electric polarization (~60-70 $\mu C/cm^2$).

2. In the present invention, a conductive oxide matching the lattice of bismuth ferrite is used as the buffer layer, which facilitates crystallization of bismuth ferrite at a low temperature and optimizes its electrical properties.

3. The bismuth ferrite film material of the present invention does not contain any toxic element, and hence is green and environment-friendly; the preparation process is simple and the equipment is easy to operate, the raw materials used are commercially available with a low cost; the bismuth ferrite film material is easy for device integration and suitable for mass production.

BRIEF DESCRIPTION OF THE DRAWINGS

The accompanying drawings, which are incorporated in and constitute a part of this application, are included to provide a further understanding of the application, and the description of the exemplary embodiments and illustrations of the application are intended to explain the application and are not intended to limit the application.

DETAILED DESCRIPTION

Figure 1:
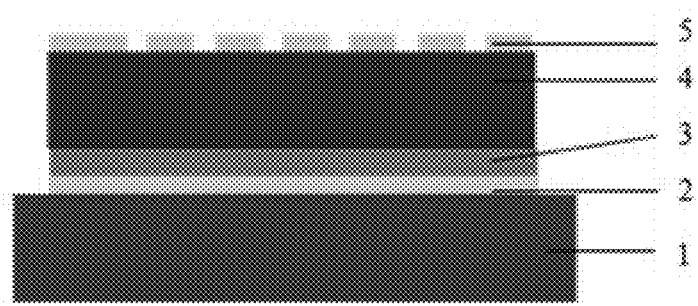
FIG. 1 is a schematic diagram of the structure for preparing a bismuth ferrite film material according to Example 1 of the present invention, 1: substrate, 2: bottom electrode, 3: buffer layer, 4: bismuth ferrite film, 5: top electrode.

It should be noted that the following detailed descriptions are exemplary and are intended to provide further illustration of the present invention. Unless otherwise indicated, all technical and scientific terms used herein have the same meaning as commonly understood by one of ordinary skill in the art to which the present invention belongs.

It should be noted that the terminology used herein is intended to describe specific embodiments only and is not intended to limit the exemplary embodiments according to the present invention. As used herein, unless the context clearly indicates otherwise, the singular form is also intended to include the plural form, and it is further understood that when the terms "comprising" and/or "including" are used in this specification, they indicate the presence of features, steps, operations, devices, components, and/or combinations thereof.

In view of the difficulty in existing preparation technologies of bismuth ferrite film to satisfy both a low preparation temperature and a high spontaneous electric polarization, the present invention proposes a bismuth ferrite film material, a method for integrally preparing a bismuth ferrite film on a silicon substrate at a low temperature, and an application thereof.

According to an exemplary embodiment of the present invention, a method for integrally preparing a bismuth ferrite film on a silicon substrate at a low temperature is provided, the method comprises: magnetron sputtering a bottom electrode, a buffer layer and a bismuth ferrite film on one surface of a Si substrate in sequence from bottom to top at a processing temperature of 300-400° C.; reducing the temperature to room temperature, and a top electrode is deposited via magnetron sputtering on the surface of the bismuth ferrite film; the buffer layer is a conductive oxide which matches the lattice of bismuth ferrite and is of a perovskite structure ($ABO_3$).

According to the present invention, the addition of the conductive oxide with a perovskite structure matching the lattice of bismuth ferrite as a buffer layer can induce the crystallization of bismuth ferrite at a low temperature, forming a well-crystallized bismuth ferrite film and enhancing the spontaneous electric polarization of the bismuth ferrite film material prepared at the low temperature.

The substrate of the present invention is a silicon material such as silicon and/or silicon dioxide. The method of the present invention can contribute to the applications of bismuth ferrite film in silicon-based integrated circuits, because the processing temperature of the latter needs to be low.

In the data range provided by the present invention, if the unit exists only after the upper value of the range, the unit of its lower value is the same as that of the upper value by default. For example, if the data range is "10-30 min", the unit of "10" defaults to "min" (minute).

In order to solve the problem of a reduced spontaneous electric polarization associated with a lowered preparation temperature of the bismuth ferrite film, in one or more examples of the embodiment, the present invention performs the following operations, comprising: after magnetron sputtering of the bismuth ferrite film, performing a holding at the preparation temperature and then cooling, then magnetron sputtering the top electrode on the surface of the bismuth ferrite film at room temperature; the holding is performed at 300-400° C. in an oxygen-containing atmosphere, with a holding time of 10-30 min. The addition of the "holding" process resulted in a high spontaneous electric polarization of the bismuth ferrite film material prepared at the low temperature. The oxygen-containing atmosphere refers to a pure oxygen atmosphere or a mixed atmosphere of oxygen and other gases, such as air.

In this series of embodiments, in the "holding" process, the pressure or partial pressure of the oxygen is 1 Pa-30 kPa. For example, 1-9 Pa, 1-7 Pa, 1-5 Pa, 1-3 Pa, 2-9 Pa, 2-7 Pa, 2-5 Pa, 2-3 Pa, 3-9 Pa, 3-7 Pa, 3-5 Pa, 5-9 Pa, 5-7 Pa, 5-6 Pa, 7-9 Pa, 7-8 Pa, 8-9 Pa, 2.5-10 Pa, 2.5-100 Pa, 2.5 Pa-10 kPa, 2.5 Pa-30 kPa, 5 Pa-30 kPa, 10 Pa-30 kPa, 100 Pa-30 kPa, 1-30 kPa, 10-30 kPa, 20-30 kPa, etc.

In the series of embodiments, lowering the temperature to 50-100° C., changing the atmosphere to an air atmosphere, then lowering the temperature to room temperature, and magnetron sputtering the top electrode on the surface of the bismuth ferrite film.

In one or more examples of the embodiment, an atmosphere for magnetron sputtering of the bismuth ferrite film is a mixed atmosphere of argon and oxygen, and the volume ratio of the argon to the oxygen is 30-110:5-30.

In one or more examples of the embodiment, a pressure for magnetron sputtering of the bismuth ferrite film is 0.3-2 Pa, and a sputtering power for the bismuth ferrite film is 60-150 W.

In one or more examples of the embodiment, a thickness of the bismuth ferrite film is 50 nm-2 μm.

In one or more examples of the embodiment, an atmosphere for magnetron sputtering of the buffer layer is a mixed atmosphere of argon and oxygen, and the volume ratio of the argon to the oxygen is 30-110:5-30.

In one or more examples of the embodiment, a pressure for magnetron sputtering of the buffer layer is 0.3-2 Pa, and a sputtering power for the buffer layer is 60-150 W.

In one or more examples of the embodiment, a thickness of the buffer layer is 50-300 nm.

The material of the buffer layer is a conductive oxide that can match the lattice of bismuth ferrite, such as cobalt strontium lanthanum oxide (LSCO), strontium ruthenate oxide (SRO), Lanthanum nickel oxide (LNO), etc.

In one or more examples of the embodiment, an atmosphere is argon for magnetron sputtering of the bottom electrode.

In one or more examples of the embodiment, a pressure is 0.1-1 Pa and a sputtering power is 30-80 W when magnetron sputtering the bottom electrode.

The material of the bottom electrode is generally an inert metal with lower metal activity than hydrogen, such as copper, gold, silver, platinum, titanium, etc. In one or more examples of the embodiment, the bottom electrode is made of titanium and platinum. When the bottom electrode is two or more metals, different metal layers are sequentially deposited by magnetron sputtering, for example, a titanium layer is sputtered first, and then a platinum layer is sputtered.

In one or more examples of the embodiment, a thickness of the bottom electrode is 50-300 nm.

In one or more examples of the embodiment, putting the substrate into a vacuum sputtering chamber, pumping the chamber to a base pressure of $0.5 \times 10^{-4}$-$1.5 \times 10^{-4}$ Pa, and heating the substrate to 300-400° C. in an argon atmosphere, which flows in the chamber at 20-60 sccm and has a pressure of 1-3 Pa, and then sequentially magnetron sputtering the bottom electrode, the buffer layer, and the bismuth ferrite film.

In one or more examples of the embodiment, an atmosphere is air, and a sputtering power is 40-90 W for the magnetron sputtering of the top electrode.

The top electrode is generally made of noble metals, such as gold, silver, platinum, etc. In one or more examples of the embodiment, the top electrode is made of gold or platinum.

According to another embodiment of the present invention, a bismuth ferrite film material is provided, which is obtained by a method for integrally preparing a bismuth ferrite film on a silicon substrate at a low temperature as described above.

The bismuth ferrite film material provided by the present invention has a relatively high spontaneous electric polarization, especially a relatively high remnant polarization value.

According to a third embodiment of the present invention, an application of a bismuth ferrite film material as described above in a sensor, a memory, an actuator, an optical device, or a spintronic device is provided.

In order to enable a person skilled in the art to understand the technical solution of the invention more clearly, the technical solution of the invention will be described in detail below in conjunction with specific examples.

Example 1

(a) Pretreatment of a Substrate

Taking semiconductor Si/SiO$_2$ as a substrate, putting the substrate into a load lock, and then loading the substrate into a sample tray of a vacuum sputtering chamber.

Pumping: closing the vacuum chamber and pumping down, so that the pressure in the chamber reaches $\sim 10^{-4}$ Pa.

Heating: introducing Ar into the chamber with a pressure of 2.3 Pa, and then heating the substrate to a temperature of 350° C., keeping the temperature stable.

(b) Preparation of a Bottom Electrode

Using titanium and platinum as sputtering targets, a bottom electrode was deposited by radio frequency magnetron sputtering. The sputtering pressure was adjusted to 0.3 Pa and the sputtering power was adjusted to 55 W. The two metals were deposited by sputtering on the substrate sequentially with a total thickness of 150 nm.

(c) Preparation of a Buffer Layer

A buffer layer was deposited by radio frequency magnetron sputtering using lanthanum nickel oxide ceramics as the sputtering target. The sputtering atmosphere was Ar and O$_2$, a flow rate of Ar was 60 sccm, a flow rate of O$_2$ was 15 sccm, a sputtering pressure was 1.2 Pa, a sputtering power was 100 W, and a thickness of the lanthanum nickel oxide layer is 150 nm.

(d) Preparation of a Bismuth Ferrite Film

Bismuth ferrite oxide ceramics were used as sputtering targets, and a bismuth ferrite film was deposited by radio frequency magnetron sputtering. A sputtering atmosphere was Ar and O$_2$, a flow rate of Ar was 60 sccm, a flow rate of O$_2$ was 15 sccm, a sputtering pressure was 1.2 Pa, a sputtering power was 100 W, and a thickness of the bismuth ferrite layer was 1 μm.

(e) Holding and Cooling

Pure O$_2$ was introduced into the chamber with a pressure of 2.5 Pa and maintained at the preparation temperature of bismuth ferrite film (350° C.) for 10 min, then the temperature was lowered to below 100° C. without changing the parameters.

(f) Preparation of a Top Electrode

At room temperature, a top electrode was deposited in a direct current sputtering manner by using a gold foil as the sputtering target. A sputtering atmosphere was air, and a discharge current is about 9 mA. A shadow mask was covered on the bismuth ferrite dielectric film to obtain a series of top electrode dots with a diameter of 200 μm.

The heterostructure prepared by the above process was shown in FIG. 1, which is, in order from bottom to top, as substrate 1, bottom electrode 2, buffer layer 3, bismuth ferrite film 4, and top electrode 5.

Figure 2:
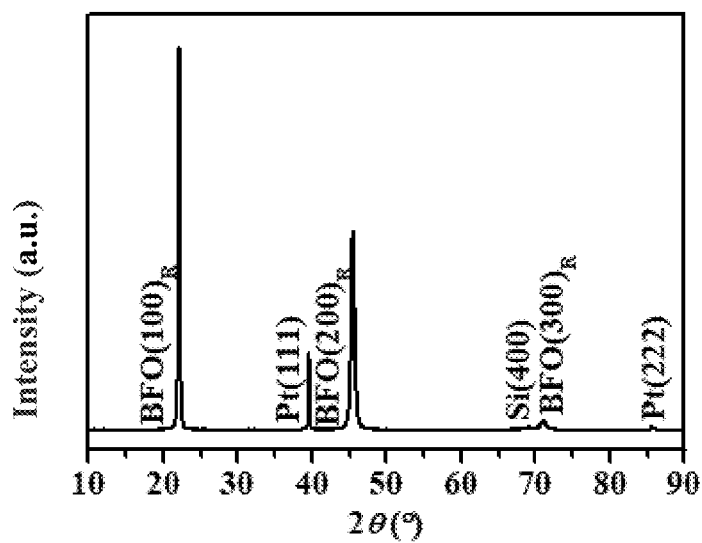
FIG. 2 is an XRD diagram of a bismuth ferrite film prepared according to Example 1 of the present invention.

The XRD pattern of the bismuth ferrite film prepared in the example was shown in FIG. 2, it was a rhombohedral phase with a (100) preferred-orientation.

Example 2

The difference between this example and example 1 is that: in step (a), the substrate was heated to a temperature of 400° C.

Example 3

The difference between this example and example 1 is that: in step (d), the thickness of bismuth ferrite film was 60 nm.

Example 4

The difference between the example and example 1 is that: in step (e), the atmosphere for holding and cooling was air, and the pressure was 1 standard atmosphere.

The bismuth ferrite films prepared by various embodiments had significantly improved ferroelectric performance, as measured via electrical testing. The electrical performance of example 1 was shown in Table 1. The remnant polarization value was about 60 μC/cm$^2$, which was close to the theoretical value (about 55 μC/cm$^2$) of the remnant polarization for the (l00) orientation. The performances of the bismuth ferrite films in other examples were similar to that of example 1.

TABLE 1

| Characteristic values of the ferroelectric hysteresis loop in Example 1 | | | |
| --- | --- | --- | --- |
| Saturation polarization value | Remnant polarization value | Positive coercive electric field | Negative coercive electric field |
| ~80 μC/cm$^2$ | ~60 μC/cm$^2$ | ~+380 kV/cm | ~−35 kV/cm |

Example 5

An energy harvester, with the same material structure as that in Example 1 of the present invention, was tested at voltages from 1 to 7 V, and the piezoelectric test results were shown in Table 2. The test results revealed that, the energy harvester has excellent piezoelectric properties, including a large piezoelectric coefficient, a high figure of merit (FOM), a large electromechanical coupling coefficient, a high voltage response, a high power efficiency and a large signal-to-noise ratio, and has the advantages of voltage stability and a low working voltage, meeting the current requirements of miniaturization, low working voltage and low cost for micro-electromechanical devices.

TABLE 2

Piezoelectric test results

| Piezoelectric coefficient ($e_{31,f}$) | Figure of merit (FOM) | Electromechanical coupling coefficient $k_{31,f}$ | Voltage Response | Power efficiency | Signal-to-noise ratio |
|---|---|---|---|---|---|
| 2.7-2.9 C/m$^2$ | 4.0-4.7 GPa | 0.016-0.019 | (−1.5)-(−1.6) GV/m | 2.7-3.1 | 1.46-1.57 C/m$^2$ |

Comparative Example 1

The difference between the example and example 1 is that: there was no step (c) and the buffer layer in step (c).

After electrical testing, the results show that there was no hysteresis loop obtained which is of the ferroelectric nature.

Comparative Example 2

The difference between the example and example 1 is that: in step (e), there was no "holding" process in oxygen, and the substrate was directly cooled down in oxygen.

After the electrical testing, as shown in Table 3, the ferroelectric properties were significantly inferior to those of Examples 1-4, the saturation polarization and remnant polarization values were significantly reduced.

TABLE 3

Characteristic values of the ferroelectric hysteresis loop in Comparative Example 2

| Saturation polarization value | Remnant polarization value | Positive coercive electric field | Negative coercive electric field |
|---|---|---|---|
| ~45 μC/cm$^2$ | ~31 μC/cm$^2$ | ~+470 kV/cm | ~−30 kV/cm |

The above descriptions are only for some preferred embodiments of the present invention and are not intended to limit the present invention, which is subject to various changes and variations for those skilled in the art. Any modification, equivalent replacement, improvement, etc. made within the spirit and principles of the present invention, shall be included in the scope of protection of the present invention.

What is claimed is:

1. A method for integrally preparing a bismuth ferrite film on a silicon substrate, the method comprising, in order:

magnetron sputtering a bottom electrode, a buffer layer and a bismuth ferrite film on one surface of a Si substrate in sequence from bottom to top at a processing temperature of 300-400° C.;

performing a holding process in an oxygen-containing atmosphere at the processing temperature of 300-400° C., a pressure of 1 Pa-30 kPa, and a holding time of 10-30 min;

reducing the processing temperature to 50-100° C. and changing the atmosphere to an air atmosphere;

reducing the processing temperature to room temperature; and depositing a top electrode via magnetron sputtering on the surface of the bismuth ferrite film, wherein the buffer layer is a conductive oxide which matches the lattice of bismuth ferrite and is of a perovskite structure.

2. The method according to claim 1, wherein an atmosphere for magnetron sputtering of the bismuth ferrite film is a mixed atmosphere of argon and oxygen, and the volume ratio of the argon to the oxygen is 30-110:5-30.

3. The method according to claim 1, wherein a pressure for magnetron sputtering of the bismuth ferrite film is 0.3-2 Pa.

4. The method according to claim 1, wherein a sputtering power for the bismuth ferrite film is 60-150 W.

5. The method according to claim 1, wherein an atmosphere is argon for magnetron sputtering the bottom electrode.

6. The method according to claim 1, wherein a pressure is 0.1-1 Pa and a sputtering power is 30-80 W when magnetron sputtering the bottom electrode.

7. The method according to claim 1, wherein the material of the bottom electrode is titanium and platinum.

8. The method according to claim 1, wherein a thickness of the bismuth ferrite film is 50 nm-2 μm.

9. The method according to claim 1, wherein a thickness of the buffer layer is 50-300 nm.

10. The method according to claim 1, wherein a thickness of the bottom electrode is 50-300 nm.

11. The method according to claim 1, further comprising, before sequentially magnetron sputtering the bottom electrode, the buffer layer, and the bismuth ferrite film:

loading the substrate into a vacuum sputtering chamber, pumping the chamber to a base pressure of 0.5×10$^{-4}$-1.5×10$^{-4}$ Pa, and heating the substrate to 300-400° C. in an argon atmosphere with a pressure of 1-3 Pa.

12. The method according to claim 1, wherein an atmosphere is air and a sputtering power is 40-90 W when magnetron sputtering the top electrode.

* * * * *